United States Patent
Yu et al.

(10) Patent No.: US 8,557,631 B2
(45) Date of Patent: Oct. 15, 2013

(54) INTERPOSER WAFER BONDING METHOD AND APPARATUS

(75) Inventors: Chen-Hua Yu, Hsinchu (TW); Chien-Chia Chiu, Zhongli (TW); Cheng-Chieh Hsieh, Yongkang (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/308,742

(22) Filed: Dec. 1, 2011

(65) Prior Publication Data
US 2013/0140713 A1    Jun. 6, 2013

(51) Int. Cl.
*H01L 21/00*    (2006.01)

(52) U.S. Cl.
USPC .......................................................... 438/106

(58) Field of Classification Search
USPC .................................................. 438/109, 401
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,481,133 A | 1/1996 | Hsu | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |

(Continued)

OTHER PUBLICATIONS

Srinivasan, U.; Liepmann, D.; Howe, R.T.; , "Microstructure to substrate self-assembly using capillary forces," Microelectromechanical Systems, Journal of , vol. 10, No. 1, pp. 17-24, Mar. 2001.*

(Continued)

*Primary Examiner* — Thao Le
*Assistant Examiner* — Laura Dykes
(74) *Attorney, Agent, or Firm* — Eschweiler & Associates, LLC (57) ABSTRACT

The present disclosure relates to a method for fast and precise alignment and mounting of a top die onto an interposer wafer. The method is performed by applying a hydrophobic self assembled monolayer to a carrier wafer in a pattern defining a top die placement region correlating to an arrangement of a top die on an interposer wafer. A liquid is provided into the top die placement region and a top die is placed into contact with the liquid. The surface tension of the liquid automatically aligns the top die by generating a force causing the top die to overlap with the top die placement region. The liquid is then eliminated and the top die is affixed to the carrier wafer. The carrier wafer is bonded to the interposer wafer, bringing the top die into contact with an interposer.

13 Claims, 11 Drawing Sheets

(56) References Cited

U.S. PATENT DOCUMENTS

| | | |
|---|---|---|
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2002/0164419 A1* | 11/2002 | Fukushima et al. ........ 427/248.1 |
| 2003/0015286 A1* | 1/2003 | De et al. ................... 156/344 |
| 2009/0023243 A1* | 1/2009 | Koyanagi .................. 438/107 |
| 2011/0008632 A1* | 1/2011 | Zheng et al. ............... 428/457 |

OTHER PUBLICATIONS

Amit Kumar, et al., "Patterning Self-Assembled Monolayers: Applications in Materials Science", Langmuir, 1994, 10, American Chemical Socity, p. 1498-1511.

Xiaorong Xiong, et al., "Geometric Binding Site Design for Surface-Tension Driven Self-Assembly", Depatment of Electrical Engineering University of Washington, Seattle, WA 98195-2500, p. 1-8.

Fengda Sun, at al., "Surface-Tension-Driven Multi-Chip Self-Alignment Techniques for Heterogeneous 3D Integration", 2011 IEEE Electronic Components and Technology Conference, p. 1153-1159.

* cited by examiner

INTERPOSER WAFER BONDING METHOD AND APPARATUS

BACKGROUND

The semiconductor industry has continually improved the processing capabilities and power consumption of integrated chips by shrinking the minimum feature size of chip components (e.g., by shrinking the minimize gate size of a transistor through improvements in lithographic processes). However, in recent years process limitations have made it difficult to support the continued shrinking of minimum feature size.

The vertical stacking of integrated chips (e.g., on top of one another) has emerged as a potential alternative approach to improving integrated chip performance by shrinking the minimum feature size. For example, a three dimensional integrated chip (3DIC) is a single integrated circuit built by vertically stacking silicon die. By interconnecting the vertically stacked silicon die to behave a single chip, the interconnection distance is shortened, improving processing capabilities and reducing power consumption.

In many stacked chip structures, an interposer substrate (e.g., glass or silicon interposer substrates) is configured between stacked integrated chip (IC) die to provide for structural stability, improved heat dissipation, improved interconnection, etc. The wiring on a stacked IC die corresponds to a location of micro-bumps on the interposer substrate. The micro-bumps connect respective IC dies to through silicon vias (TSV), which are vertical electrical connections extending through the interposer substrate (e.g., to provide connections from an upper die to a lower die).

During processing, an IC die is aligned with a micro-bump region and then the IC die is brought into contact with an interposer substrate. The IC die and interposer substrate are heated, causing the micro-bumps of the IC die to fuse with the corresponding micro-bumps of the interposer substrate. In general, alignment of an IC die to a micro-bump region is done by manual alignment. Since micro-bump regions are small, alignment is difficult and can be time consuming.

SUMMARY OF THE DISCLOSURE

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to the more detailed description that is presented later.

In one embodiment, the present disclosure relates to a method of self aligning a top die onto a carrier wafer. The method is performed by providing a carrier wafer having a top surface and a bottom surface. A hydrophobic self assembled monolayer (SAM) is applied to the top surface of the carrier wafer in a predefined pattern that defines one or more top die placement regions correlating to an arrangement of one or more top die on an interposer wafer. One or more top die are then self aligned onto the surface of the carrier wafer within the one or more top die placement regions. The one or more top die are then affixed to the top surface of the carrier wafer such that the back side of the one or more top die is brought into contact with the top surface of the carrier wafer.

In another embodiment, the present disclosure relates to a self alignment fixture for self alignment of a top die onto a carrier wafer. The self alignment fixture comprises a wafer reception region, having a substantially flat surface configured to hold a carrier wafer having a plurality of vias connecting a bottom surface of the carrier wafer to one or more top die placement regions on a top surface of the carrier wafer. A first liquid channel connects a liquid source configured to provide a liquid to the wafer reception region. The first liquid channel comprises a first valve configured to control a flow of liquid to the plurality of vias. A first vacuum channel connects a vacuum source configured to siphon air or liquid to the wafer reception region. The first vacuum channel comprises a second valve configured to connect the vacuum source to the plurality of vias.

In yet another embodiment, the present disclosure relates to a carrier wafer that enables self alignment self alignment of a top die onto the carrier wafer. The carrier wafer comprises a plurality of vias extending perpendicular to a top surface of the carrier wafer, from a bottom surface of the carrier wafer to the top surface of the carrier wafer. A hydrophobic self assembled monolayer (SAM) located on the top surface of the carrier wafer. The SAM is patterned to expose the top surface of the carrier wafer in one or more top die placement regions that correlate to an arrangement of one or more top die on an interposer wafer and corresponding to the location of at least one of the plurality of vias. The vias are configured to provide to or remove liquid from the one or more top die placement regions.

The following description and annexed drawings set forth in detail certain illustrative aspects and implementations of the disclosure. These are indicative of but a few of the various ways in which the principles of the disclosure may be employed.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Some aspects of the present disclosure provide for an efficient method of aligning and mounting a top die onto an interposer wafer. The method comprises providing a temporal carrier wafer. A hydrophobic self assembled monolayer (SAM) (e.g., a Teflon film) is applied to the carrier wafer in a pattern that exposes the carrier wafer in a top die placement region correlating to an arrangement of the top die on an interposer wafer. A liquid (e.g., water, a dilute adhesive) is provided into the top die placement region and a top die is placed into contact with the liquid. The surface tension of the liquid automatically aligns the top die by generating a force that causes the top die to overlap with the top die placement region. The top die is then affixed to the temporal carrier wafer and the temporal carrier wafer is bonded to the interposer wafer, thereby bringing the top die into contact with the interposer wafer in a manner that provides for a fast and precise arrangement of the top die.

Figure 1A:
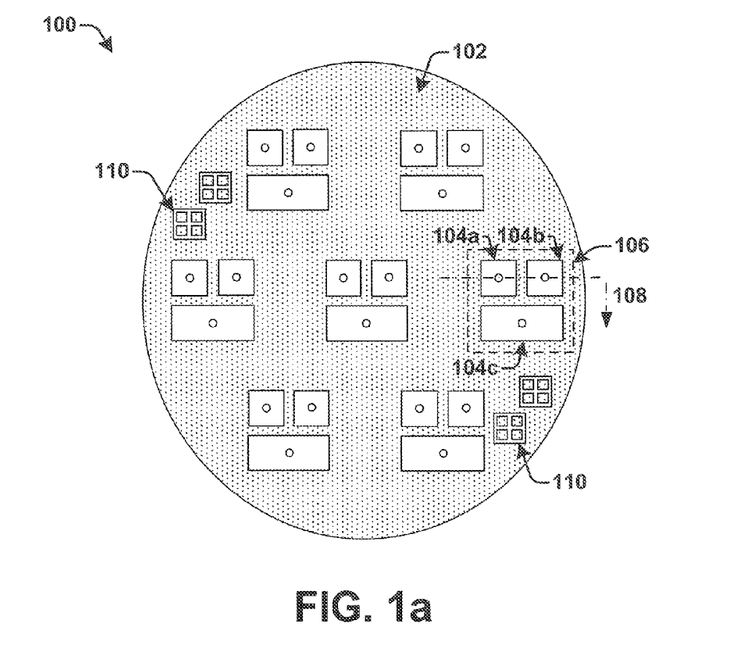
FIG. 1a illustrates a top view of some embodiments of an exemplary carrier wafer that enables top die self alignment, as provided herein.
Figure 1B:
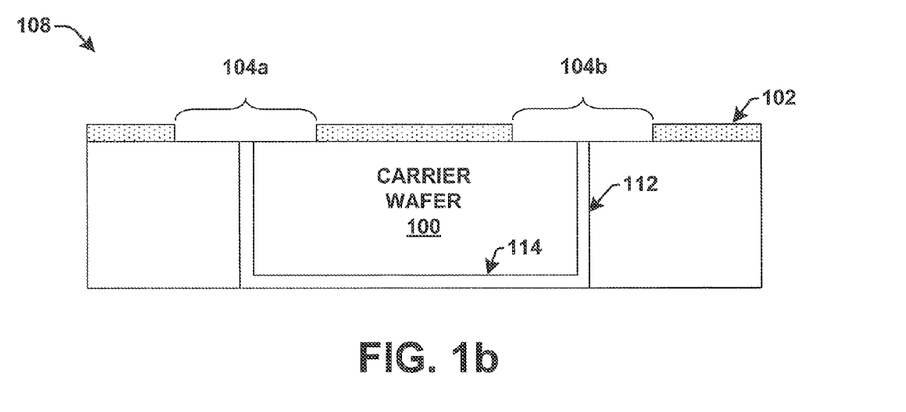
FIG. 1b illustrates a cross sectional view of some embodiments of the carrier wafer that enables top die self alignment along a cross sectional line.
Figure 1C:
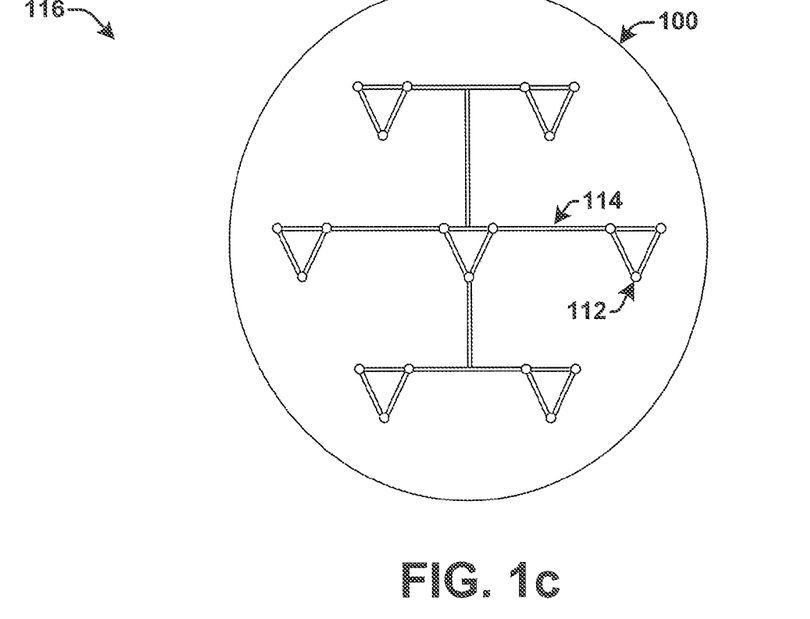
FIG. 1c illustrates a top view of some embodiments of the back side of the carrier wafer that enables top die self alignment.

FIG. 1a illustrates a top view of some embodiments of a top side of an exemplary carrier wafer 100 that enables top die self alignment (e.g., for 3D integration), as provided herein. FIG. 1b illustrates a cross sectional view of the carrier wafer 100 along cross section line 108. FIG. 1c illustrates a top view 116 of the bottom side of the carrier wafer 100. The carrier wafer 100 is a temporal carrier wafer to which one or more top die can be affixed before being placed on an interposer wafer. The carrier wafer 100 offers structural support for thin top die. In various embodiments, the carrier wafer 100 may comprise a glass or silicon wafer, for example.

As illustrated in FIG. 1a, a self assembled monolayer (SAM) 102 (e.g., a FEP Teflon film) is disposed in a predefined pattern on the top surface of the carrier wafer 100. The SAM 102 defines one or more top die placement regions 104a-104c that expose the underlying carrier wafer 100. The top die placement regions 104a-104c correlate to an arrangement of top die on a separate interposer wafer. For example, within interposer region 106 (i.e., a region corresponding to an interposer substrate), the SAM 102 defines a first top die placement region 104a corresponding to the location of a first top die on an interposer wafer, a second top die placement region 104b corresponding to the location of a second top die on the interposer wafer, and a third top die placement region 104c corresponding to the location of a third top die on the interposer wafer. The carrier wafer 100 further comprises a plurality of alignment marks 110, which correspond to alignment marks on a separate interposer wafer. The plurality of alignment marks 110 enable alignment of the carrier wafer 100 with the separate interposer wafer (e.g., having top die) to facilitate bonding of the carrier wafer 100 and interposer wafer.

As illustrated in the cross sectional view of FIG. 1b, the SAM 102 is disposed in a predefined pattern onto a top surface of the carrier wafer 100. The SAM 102 comprises a hydrophobic surface (i.e., which repels water) that may be formed to a thickness of a few nanometers, using methods known to one of ordinary skill in the art. The hydrophobic surface of the SAM 102 is contrasted with the exposed carrier wafer 100, which provides for a non-hydrophobic surface within the one or more top die placement regions 104a-104c.

In one embodiment, the carrier wafer 100 may comprise a plurality of vias 112 that extend perpendicular to the top surface of the carrier wafer 100. The vias 112 extend from a bottom surface of the carrier wafer (i.e., the back side of the wafer) to the top surface of the carrier wafer (i.e., the front side of the wafer), and are configured to provide liquid and/or air to and/or remove liquid and/or air from in-between a top die and the carrier wafer 100. In an additional embodiment, the carrier wafer 100 may further comprise trenches 114 extending along the bottom surface of the carrier wafer in a direction parallel to the surface of the carrier wafer. FIG. 1c illustrates some embodiments of a top view 116 of the bottom side of the carrier wafer. As illustrated in FIG. 1c, the trenches 114 extend between the plurality of vias 112 tho as to connect two or more vias 112 in the carrier wafer 100 together.

Referring again to FIG. 1b, the predefined pattern of the SAM 102, which defines top die placement regions 104a-104b, exposes the carrier wafer 100 in top die placement regions comprising the vias 112 (i.e., vias extend through the carrier wafer to the top die placement regions) so that each die placement region has at least one via 112. This allows for the vias 112 to be used to provide liquid to and/or to remove liquid and/or air from the top surface of the carrier wafer. For example, in one embodiment, the vias 112 provide liquid to the top die placement regions 104a-104b from the back side of the carrier wafer, and remove liquid from the top die placement regions 104a-104b. In an alternative embodiment, a liquid is applied to the top die placement regions 104a-104b from the front of the carrier wafer by an external apparatus (i.e., by an apparatus that is not physically connected to the carrier wafer) and the vias 112 are used to remove the liquid from the carrier wafer. Since the top die placement regions 104a and 104b are defined by the hydrophobic SAM 102, the liquid is contained within the top die placement regions 104a and 104b.

In one embodiment, SAM 102 is patterned on the carrier wafer 100 to define top die placement regions 104a-104c having a size that is substantially equal to a corresponding top die. In another embodiment, wherein the back side of a top die has a SAM layer defining non-hydrophobic regions, SAM 102 is patterned on the carrier wafer 100 to define top die placement regions 104a-104c having a shape/size that is the same as or similar to the non-hydrophobic regions defined on back side of top die.

Figure 2:
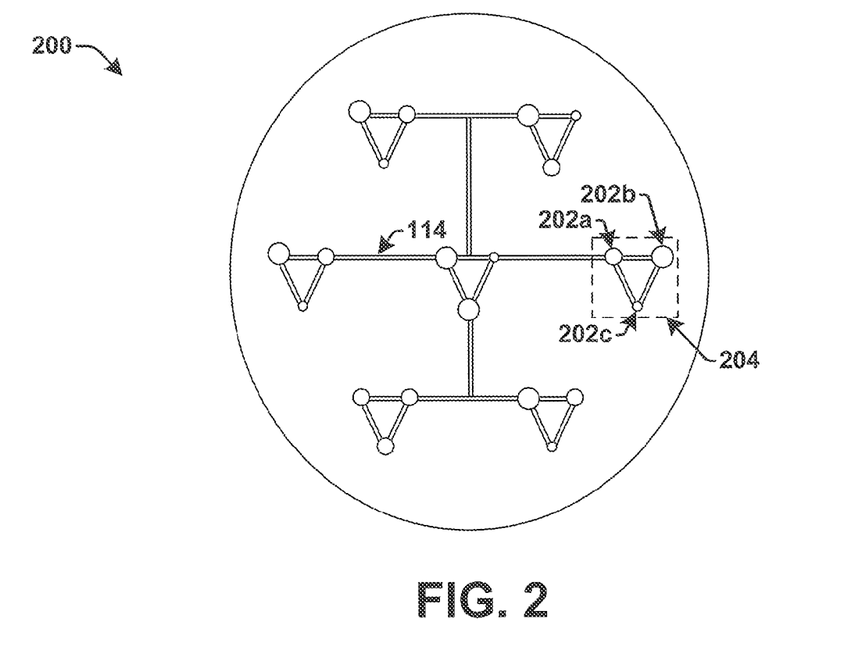
FIG. 2 illustrates a top view of the back side of an alternative embodiment of a carrier wafer that enables top die self alignment.

FIG. 2 illustrates a top view of the bottom side of an alternative embodiment of a carrier wafer 200 that enables self alignment of a top die. The carrier wafer 200 comprises a plurality of vias (e.g., 202a, 202b, and 202c), wherein each via is associated with a top die placement region on the front side of the carrier wafer 200. As illustrated in FIG. 2, the vias (e.g., 202a, 202b, and 202c), have various diameters. The different via diameters allow for different amounts of liquid to pass through each via (e.g., the larger a via, the larger the volume of liquid to pass through the via). Therefore, the different diameters allow for volumes of liquid, supplied to different top die placement regions from the back of the carrier wafer, to be separately controlled for each top die placement region.

For example, a first interposer region 204 may comprise a first via 202a having a first diameter, a second via 202b having a second diameter larger than the first diameter, and a third via 202c having a third diameter smaller than the first diameter. Since the second diameter is larger than the first diameter, the second via 202b will provide a larger volume of liquid into an associated top die region than the first via 202a. Similarly, since the third diameter is smaller than the first diameter, the third via 202b will provide a smaller volume of liquid into an associated top die region than the first via 202a.

Figure 3A:
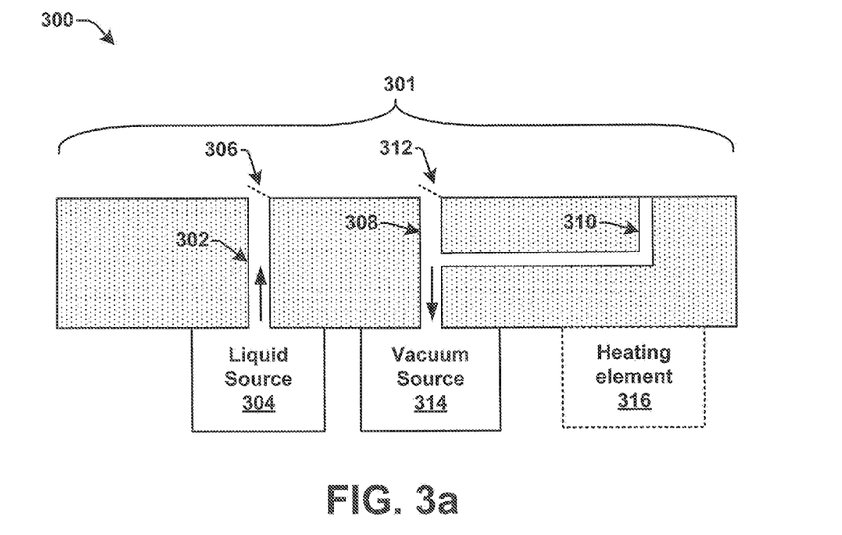
FIG. 3a illustrates some embodiments of a self alignment fixture configured to enable a carrier wafer to self align a top die.

FIG. 3a illustrates some embodiments of a self alignment fixture 300 configured to enable a carrier wafer (e.g., carrier wafer 100) to self align a top die. In some embodiments, the self alignment fixture 300 is configured to supply and/or remove liquid and/or air to/from top die placement regions on a carrier wafer.

The self alignment fixture 300 comprises a top surface comprising a wafer reception region 301 that is a substantially flat surface configured to hold a carrier wafer. One more liquid channels are configured to connect a liquid source 304 to the wafer reception region 301. As illustrated in FIG. 3a, the self alignment fixture 300 comprises a liquid channel 302 that provides liquid (e.g., water, a dilute adhesive) from a liquid source 304 to the wafer reception region 301 (e.g., enabling the liquid to go to one or more top die regions on a top surface of a carrier wafer held within the wafer reception region). A first valve 306 is located at the end of the liquid channel 302. The first value 306 is configured to open or close depending on the self alignment fixture mode of operation.

In some embodiments, the self alignment fixture 300 further comprises one more vacuum channels configured to connect a vacuum source 314 to the wafer reception region of the carrier wafer 100. For example, the self alignment fixture 300 comprises a first vacuum channel 308 and a second vacuum channel. The first vacuum channel 308 is configured to siphon air and/or liquid from the wafer reception region 301 (e.g., enabling liquid and/or air to be extracted from one or more top die region on a top surface of a carrier wafer held within the wafer reception region). A second valve 312 located at the end of the first vacuum channel 308 is configured to open or close depending on the self alignment fixture mode of operation. The second vacuum channel 310 is configured to connect directly to the bottom surface of a carrier wafer (i.e., the back side of the wafer) so as to hold the carrier wafer onto the self alignment fixture 300 by generating a pressure difference resulting in a vacuum force. For example, if the vacuum source 314 lowers the pressure (e.g., by approximately 15 psi) in the second vacuum channel (e.g., in a cavity behind the carrier wafer), the atmospheric pressure on the top surface of a carrier wafer will hold the carrier wafer to the self alignment fixture 300.

Figure 3B:
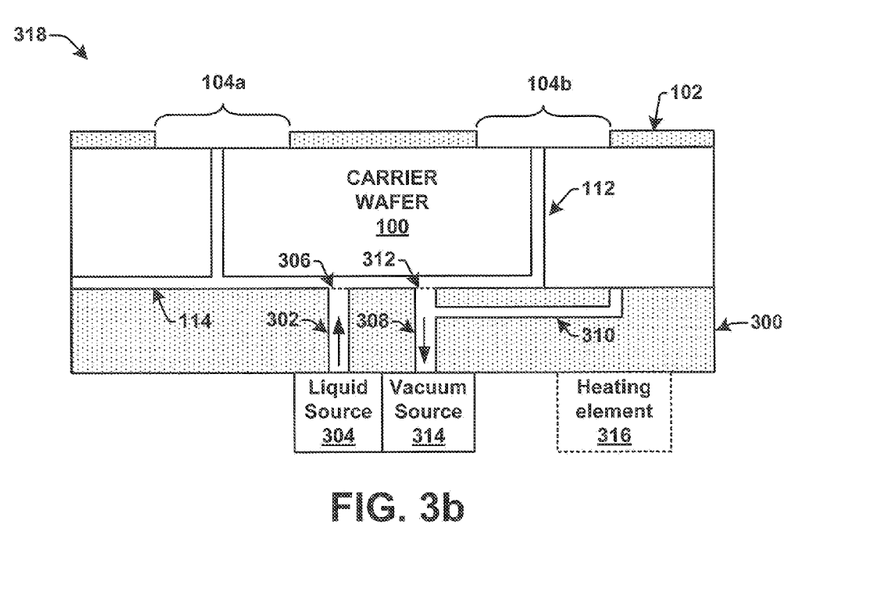
FIG. 3b illustrates some embodiments of a cross sectional view of a carrier wafer placed on the self alignment fixture.

FIG. 3b illustrates a cross sectional view 318 of some embodiments of a carrier wafer 100 placed on the self alignment fixture 300. In some embodiments, the liquid channel 302 and/or the first vacuum channel 308 is in direct communication with one or more vias 112 of the carrier wafer 100. In some alternative embodiments, shown in FIG. 3b, a trench 114 of the carrier wafer 100 is in direct communication with the liquid channel 302 and with the first vacuum channel 308. Since the trench 114 is interconnected with two or more vias, the liquid channel 302 and the first vacuum channel 308 can provide and/or remove liquid from the top die placement regions, 104a and 104b, of the carrier wafer. In one embodiment, the vacuum source 314 is connected to a same trench as the liquid source 304. In such an embodiment, the vacuum source 314 and the liquid source 304 communicate with the trench 114 by way of a first valve 306 and a second valve 312.

For example, during operation, the self alignment fixture 300 can provide liquid to the top die placement regions, 104a and 104b, by opening first valve 306 and by closing second valve 312. When valve 306 is opened, the liquid channel 302 provides a liquid, by way of a plurality of vias 112, to top die placement regions 104a and 104b on the top surface of the carrier wafer 100. The self alignment fixture 300 can remove liquid and/or air from the top die regions by closing first valve 306 and opening second valve 312 (e.g., after self alignment has been completed). When second valve 312 is open, the vacuum channel 308 removes liquid from top die placement regions 104a and 104b. After the liquid is removed, the second valve 312 may remain open to affix a top die to the surface of the carrier wafer 100.

In some embodiments, the self alignment fixture 300 comprises a heating element 316. In one embodiment, the heating element 316 is configured to heat the carrier wafer 100 to a temperature that removes a liquid located in-between a top die and the carrier wafer 100 by evaporating the liquid. After the liquid is removed, the vacuum channel 308 may be used to affix the self aligned top die to the carrier wafer 100. Utilizing the vacuum channel 308 to affix the self aligned top die to the carrier wafer 100 avoids the use of adhesives in the process. In another embodiment, wherein a dilute adhesive is located between a top die and the carrier wafer 100, the heating element 316 is configured to heat the carrier wafer 100 to a temperature causes the dilute adhesive to cure, thereby affixing the top die to the carrier wafer 100.

Figure 4A:
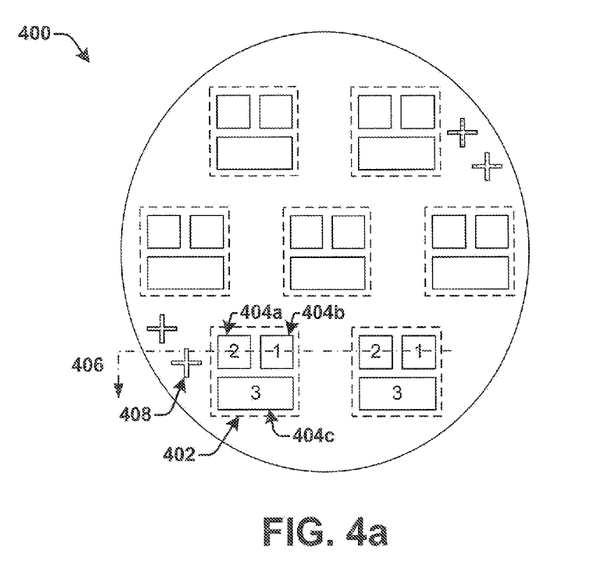
FIG. 4a illustrates some embodiments of a top view of an interposer wafer comprising a plurality of interposer substrates.

FIG. 4a illustrates a top view of some embodiments of an interposer wafer 400 comprising a plurality of interposer substrates 402. Each interposer substrate 402 comprises micro-bump regions 404a, 404b, and 404c, corresponding to the location of a top die on a carrier wafer. A plurality of alignment marks 408 are located on the interposer wafer 400. The alignment marks 408 correspond to alignment marks on a carrier wafer (e.g., alignment marks 110 in FIG. 1a), thereby enabling alignment of the carrier wafer with the interposer wafer 400 to facilitate bonding of the carrier wafer and interposer wafer 400.

Figure 4B:
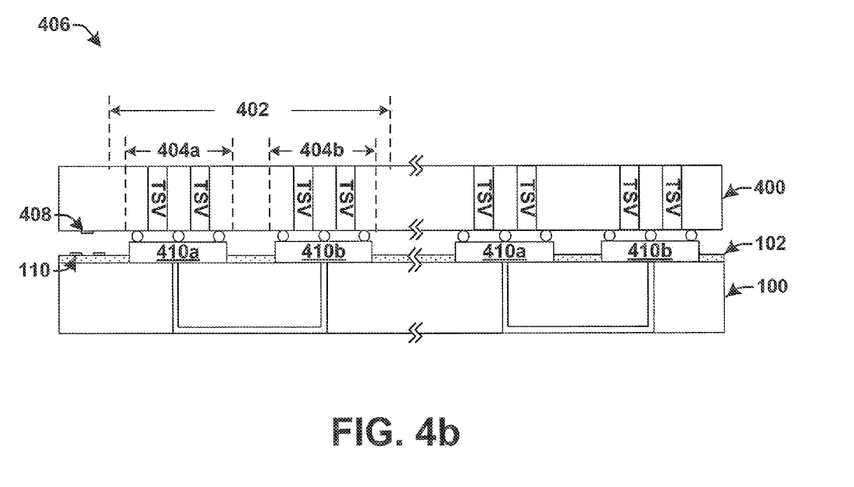
FIG. 4b illustrates some embodiments of a cross sectional view of a carrier wafer bonded to an interposer wafer.

FIG. 4b illustrates a cross sectional view 406 of some embodiments of a carrier wafer 100 bonded to interposer wafer 400. As shown in FIG. 4b, after aligning the carrier wafer alignment marks 110 with the interposer wafer alignment marks 408, a first self-aligned top die 410a on carrier wafer 100 will correspond to micro-bump region 404a, a self-aligned second top die 410b on carrier wafer 100 will correspond to micro-bump region 404b, etc. The interposer wafer 400 and top die 410a, 410b may be subsequently diced after the bonding is completed and the carrier wafer 100 has been removed. Therefore, the self alignment of the top die 410a and 410b, enable a fast and precise arrangement of the top die 410a and 410b onto an interposer substrate 402.

Figure 5:
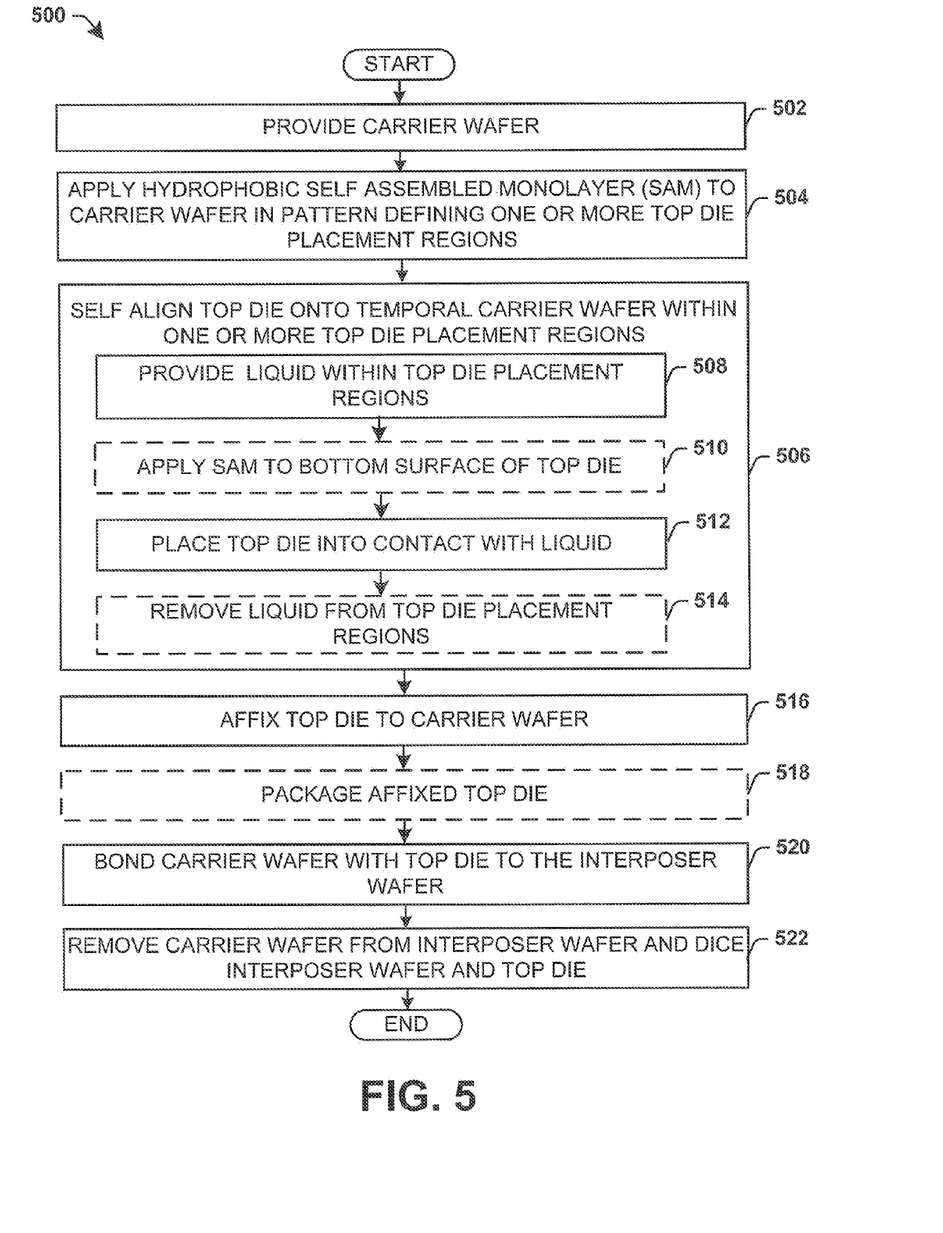
FIG. 5 illustrates a flow diagram of some embodiments of a method for self aligning a top die onto an interposer wafer.
Figure 6:
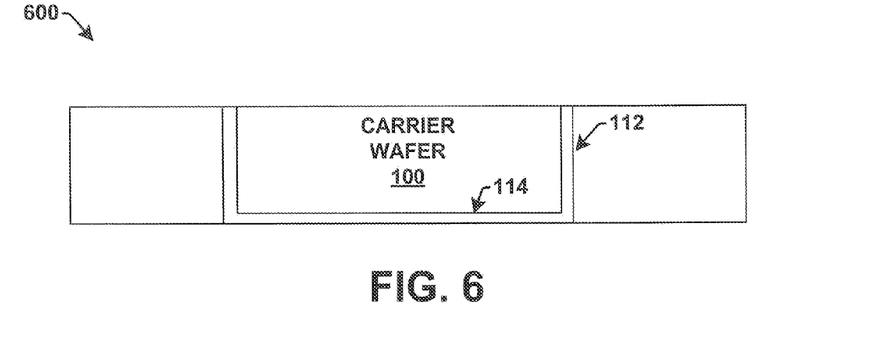
FIGS. 6-15 illustrate cross-sectional views of some embodiments of an exemplary semiconductor substrate whereon a method for self aligning a top die onto an interposer wafer is implemented.

FIG. 5 illustrates a flow diagram of an exemplary embodiment of a method 500 for self aligning a top die onto an interposer wafer. Some embodiments of an exemplary semiconductor substrate whereon such a methodology is implemented is illustrated in cross-sectional view in FIGS. 6-15. It will be appreciated that although method 500 has been illustrated with respect to two top die, method 500 can be concurrently applied to any number of top die, thereby allowing multiple top die to be self aligned onto a carrier wafer in an efficient manner.

While the method 500 provided herein is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, a carrier wafer is provided. In one embodiment, the carrier wafer may comprise a glass or silicon carrier wafer. In a more particular embodiment, the carrier wafer may comprise a plurality of vias and/or trenches configured to provide and/or remove liquid and/or air from the surface of the carrier wafer. As shown in cross sectional view 600 of FIG. 6, the carrier wafer 100 comprises a plurality of vias 112 extending from a bottom surface of the carrier wafer (i.e., the back side of the wafer) to a top surface of the carrier wafer (i.e., the front side of the wafer). In one embodiment, the carrier wafer 100 may also contain trenches 114 located along the bottom surface of the carrier wafer 100 and extending between the plurality of vias 112.

At 504 a hydrophobic self assembled monolayer (SAM) is applied to the carrier wafer in a predefined pattern defining one or more top die placement regions correlating to an arrangement of top die on an interposer substrate. In one embodiment, the SAM layer may be applied to the carrier wafer by first masking, and then coating, the carrier wafer with a Teflon material. In such an embodiment, the SAM layer is formed within the unmasked area of the carrier wafer. In an alternative embodiment, the carrier wafer may be masked and then treated with an $O_2$ plasma treatment, which makes the surface of the carrier wafer more hydrophobic. In such an embodiment, the SAM layer is formed in the unmasked area of the carrier wafer. It will be appreciated that alternative methods of forming a SAM may be used, as known by one of ordinary skill in the art.

Figure 7:
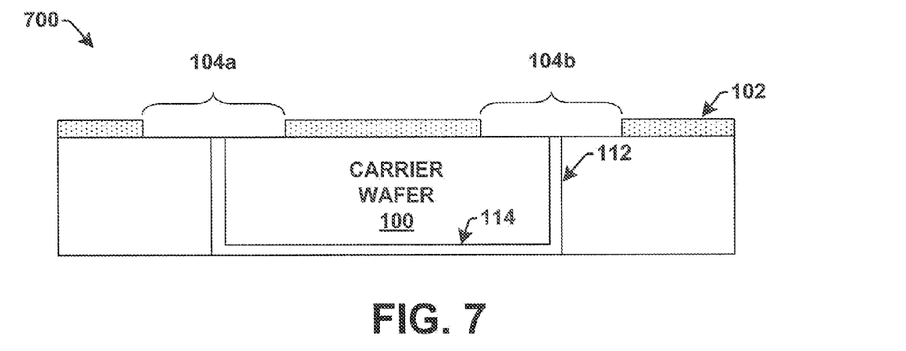

As shown in cross sectional view 700 of FIG. 7, SAM 102 is patterned to expose the carrier wafer 100 in one or more top die placement regions 104a and 104b. In one embodiment, the top die placement regions, 104a and 104b, correspond to the location at which the vias 112 extend through the carrier wafer 100. In one embodiment, the SAM 102 may be patterned to expose the carrier wafer 100 in top die placement regions 104a-104b having a size substantially equal to that of a corresponding top die. In another embodiment, wherein the back side of the top die has a non-hydrophobic region defined by a SAM (e.g., as shown below in FIG. 9), the SAM 102 may be patterned to expose the carrier wafer 100 in top die placement regions 104a-104c having a shape and size that is the same or close to the same as the non-hydrophobic region defined on back side of top die.

At 506 one or more top die are self aligned onto the carrier wafer within the one or more top die placement regions defined by the SAM.

In one particular embodiment, the top die is self aligned on the carrier wafer based upon a liquid self alignment method. For example, at 508, a liquid is provided within the SAM defined top die placement regions on the carrier wafer. In one embodiment, the liquid may be applied from the front of the carrier wafer (e.g., by an external apparatus). In another embodiment, the liquid may be provided, by way of one or more vias, from the back side of the carrier wafer.

Figure 8:
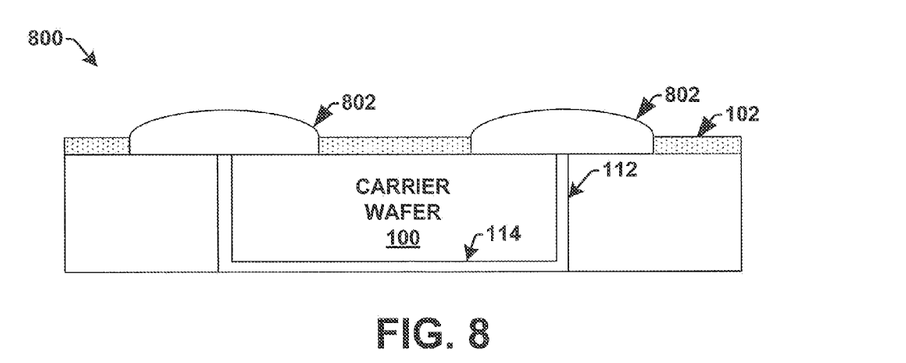

FIG. 8 illustrates a cross sectional view 800 of an embodiment, wherein a liquid 802 is provided within the top die placement regions on the carrier wafer 100. Since the SAM 102 is hydrophobic, it repels the liquid 802. This results in a surface tension that causes the liquid 802 to have a semispherical shape within the top die placement regions. In one embodiment, the liquid 802 comprises water. Water molecules are polar molecules that attract to each other. The attraction results in a high surface tension. The hydrophobic SAM 102 is non-polarized and repels the polarized water keeping the water in the top die placement regions 104a and 104b. In another embodiment, the liquid 802 comprises a dilute adhesive (e.g., an adhesive substance having a low viscosity).

Figure 9:
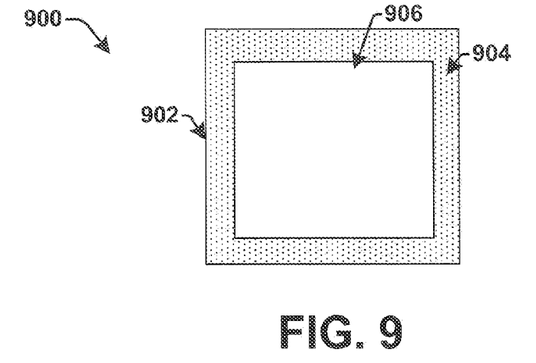

At 510 a hydrophobic self assembled monolayer (SAM) may also be applied to the outside edges of the bottom surface (i.e., the back side) of the top die, in one embodiment. For example, FIG. 9 illustrates a top view 900 of the bottom surface of a top die 902, wherein a SAM 904 is applied to the outside edges of the top die 902, resulting in a non-hydrophobic region 906. The SAM 904 causes liquid to be repelled from the outside edges of the top die bottom surface, increasing the surface tension of liquid that is in contact with the top die bottom surface.

At 512 one or more top die are placed into contact with the liquid. When a top die comes into contact with the liquid it will displace the liquid, causing the surface tension of the liquid to generate a force that acts upon the top die. The force automatically aligns the top die by pushing the top die to overlap with the SAM defined top die placement region (e.g., pushing the top die to align with the center of the top die placement region).

Figure 10:
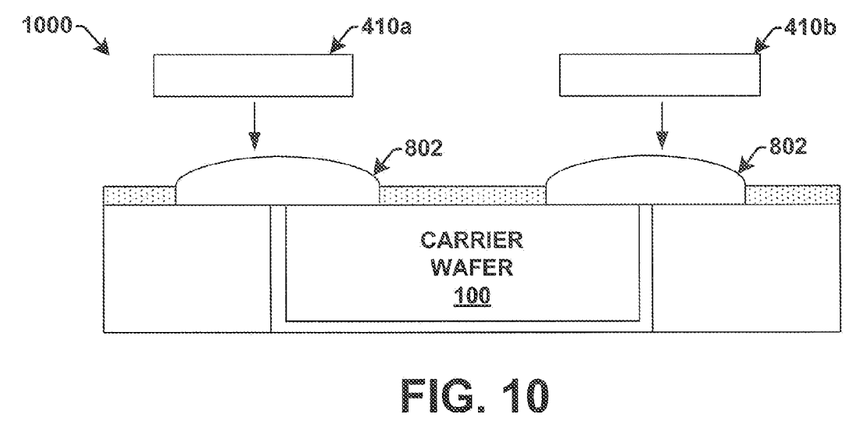

FIG. 10 illustrates a cross sectional view 1000 of top die, 410a and 410b, being placed into contact with a liquid 802 disposed within the SAM defined top die placement region on the carrier wafer 100. As illustrated in FIG. 10, top die 410a and 410b are misaligned with respect to the top die alignment regions.

Figure 11A:
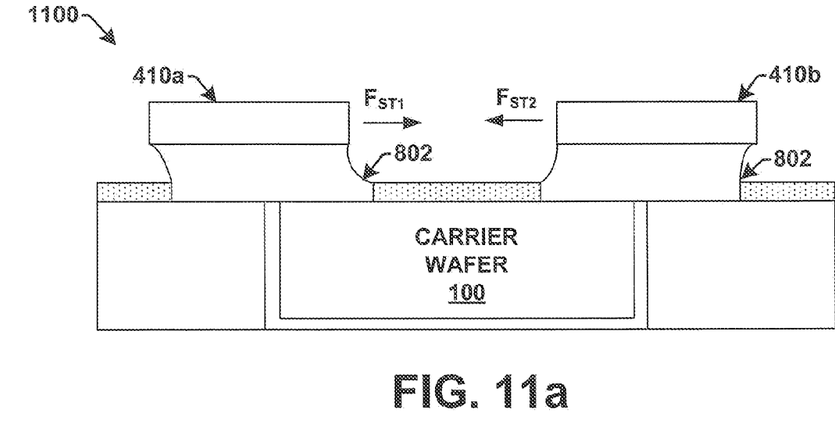

FIG. 11a illustrates a cross sectional view 1100 of top die, 410a and 410b, being acted upon by a force $F_{STx}$ generated by the surface tension of the liquid 802. Once the top die 410a and 410b come into contact with the liquid 802, the liquid 802 is displaced from its semispherical shape and the surface tension of the liquid 802 generates a force that acts upon the top die 410a, 410b to move the top die 410a, 410b into self alignment. As illustrated in FIG. 11a, a force $F_{ST1}$ acts upon the first top die 410a (which was placed left of center from the first top die placement region) to move the top die 410a into alignment with the first top die placement region. Similarly, a force $F_{ST2}$ acts upon the second top die 410b (which was placed right of center from the second top die placement region) to move the second top die 410b into alignment with the second top die placement region.

Figure 11B:
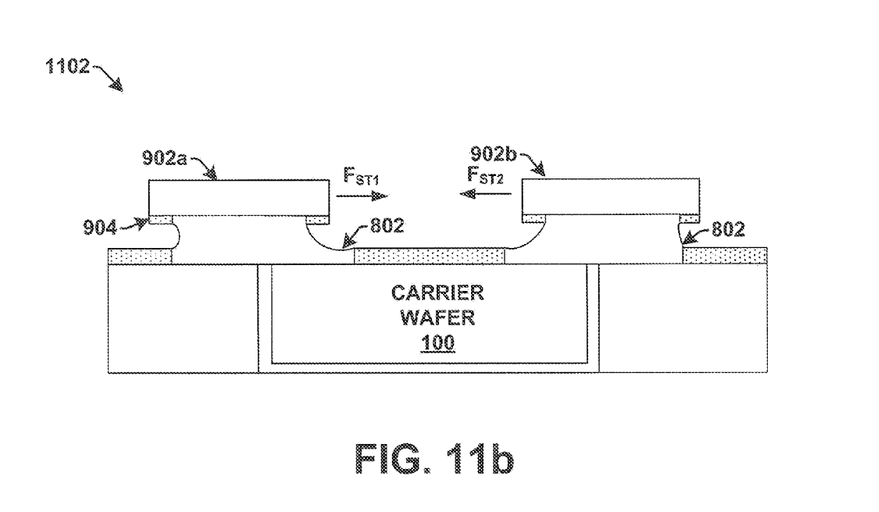

FIG. 11b illustrates a cross sectional view 1102 of top die 902a, 902b having a SAM 904 on the outside edges (e.g., corresponding to top die 902 of FIG. 9), being acted upon by a force generated by the surface tension of the liquid 802. As illustrates in FIG. 11b, the SAM 904 on the bottom surface of the top die 902a, 902b causes the liquid 802 to be located within the edges of the top die 902a and 9020b. The surface tension of the liquid 802 generates forces $F_{ST1}$ and $F_{ST2}$, which respectively act upon the first and second top die 902a and 902b to move the top die 902a, 902b into self alignment.

In some embodiments, the liquid may be removed from the one or more top die placement regions at 514. In one embodiment, the liquid is removed by siphoning the liquid through a via in the carrier wafer to extract it from the one or more top die placement regions. In an alternative embodiment, the carrier wafer may be heated to a temperature that causes the liquid to be evaporated from the one or more top die placement regions.

At 516 the top die is affixed to the temporal carrier wafer. In one embodiment, wherein the liquid is removed from the one or more top die placement regions, a vacuum apparatus is configured to generate an area of low pressure underneath the carrier wafer, which affixes the carrier wafer onto a fixture holding the carrier wafer. In an alternative embodiment, wherein the liquid comprises a dilute adhesive, the dilute adhesive may be cured (e.g., by applying heat or ultraviolet light) to affix the top die to the temporal carrier wafer.

Figure 12A:
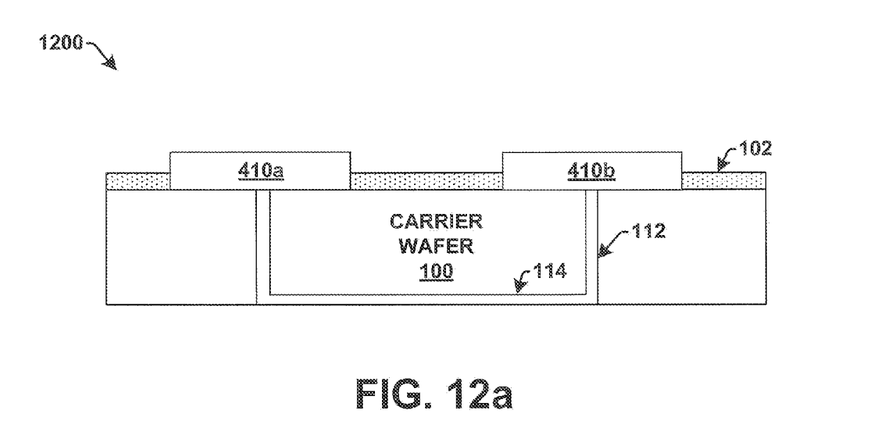

FIG. 12a illustrates a cross sectional view 1200 of a carrier wafer 100 with liquid removed from between the carrier wafer 100 and the top die, 410a and 410b. As illustrated in FIG. 12a, once the liquid has been removed from between the carrier wafer 100 and the top die 410a and 410b, the top die 410a, 410b are self aligned and in contact with the carrier wafer 100. Furthermore, since the top die, 410a and 410b, are aligned in a location above the vias 112, the vias 112 may be used to form a vacuum that affixes the top die, 410a and 410b, to the carrier wafer 100.

Figure 12B:
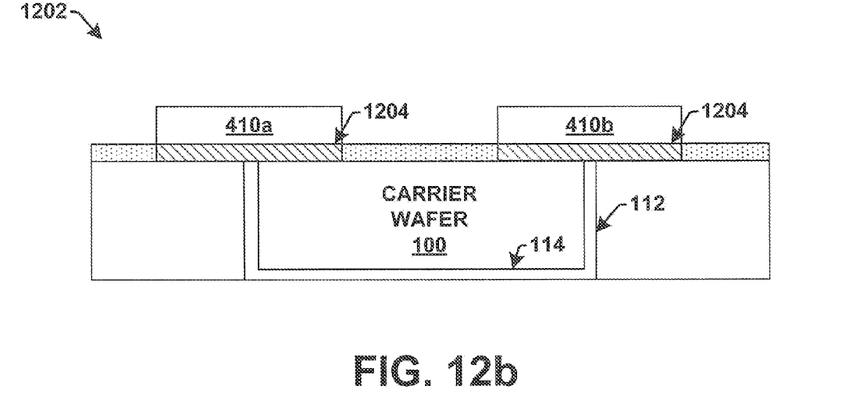

FIG. 12b illustrates a cross sectional view 1202 of a carrier wafer 100 with a dilute adhesive 1204 located between the carrier wafer 100 and the top die, 410a and 410b. As illustrated in FIG. 12a, once the top die are self aligned, the dilute adhesive 1204 is cured to affix the top die, 410a and 410b, to the carrier wafer 100.

In some embodiments, the fixed top die on the temporal carrier wafer may be packaged, at 518. In one such embodiment, packaging of the top die comprises providing an encapsulant to enclose the top die of the temporal carrier wafer. A passivation layer (e.g., a polymer) is formed on top of the encapsulant and a redistribution layer, comprising an additional layer of metal connections employed to rearrange the peripheral wirebond connections, is formed above the encapsulant. The redistribution layer enables the top die to be used in fan-out packaging (i.e., packaging having solder balls outside of the IC chip area). Accordingly, by packaging the temporal carrier wafer, method 500 can be used to enable the placement of fan out die (i.e., die coupled to solder balls outside of the top die area).

Figure 13A:
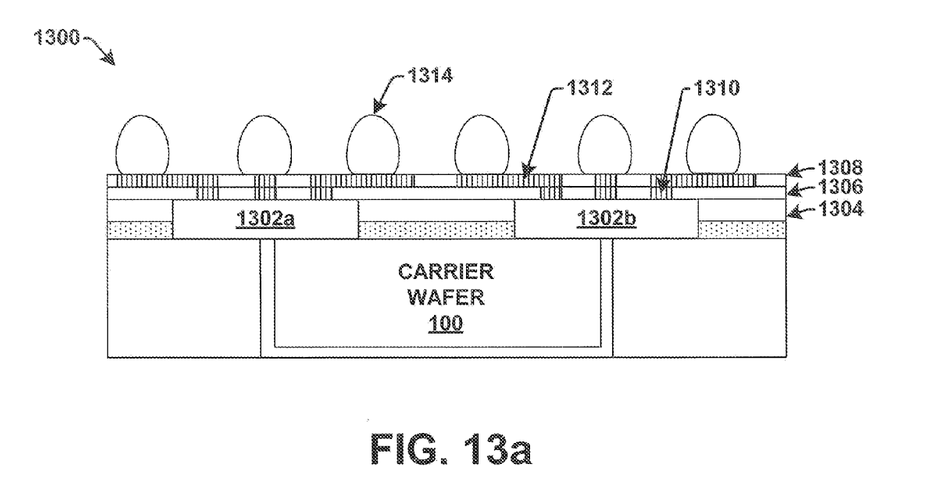
Figure 13B:
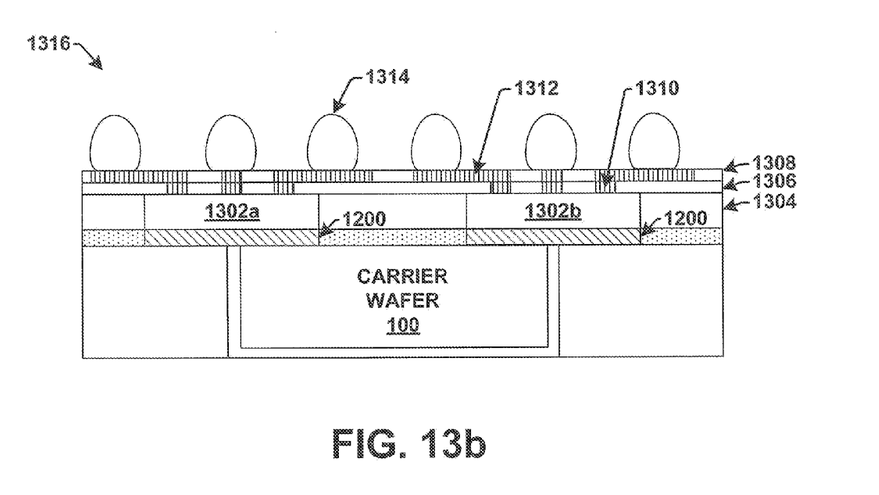

FIG. 13a illustrates a cross sectional view 1300 of one embodiment of a carrier wafer 100 having top die comprising fan out die 1302a and 1302b which are connected to solder balls 1314 outside of the IC area through a redistribution layer 1308. As illustrated in FIG. 13a, an encapsulant 1304 is formed onto fan out die 1302a and 1302b. Excess encapsulant 1304 is removed (e.g., by grinding off the molded encapsulation) to expose the top surface of the fan out die 1302a and 1302b. A passivation layer 1306 (e.g., a polymer) is formed on the top surface of the fan out die 1302a and 1302b. The passivation layer 1306 may comprise metal connections 1310 in contact with the fan out die, 1302a and 1302b. A redistribution layer 1308 is formed on top of the passivation layer 1306. The redistribution layer 1308 comprises an additional layer of metal connections 1312 employed to rearrange the peripheral wirebond connections to enable fan-out packaging (i.e., packaging having solder balls outside of the IC chip area). Solder balls 1314 are formed on top of the redistribution layer 1308. FIG. 13b illustrates a cross sectional view 1316 of an alternative embodiment of a carrier wafer 100 having fan out die 1302 packaged in an encapsulant 1304, wherein the fan out die 1302a and 1302b are affixed to the carrier wafer 100 by a cured dilute adhesive 1204.

Figure 14:
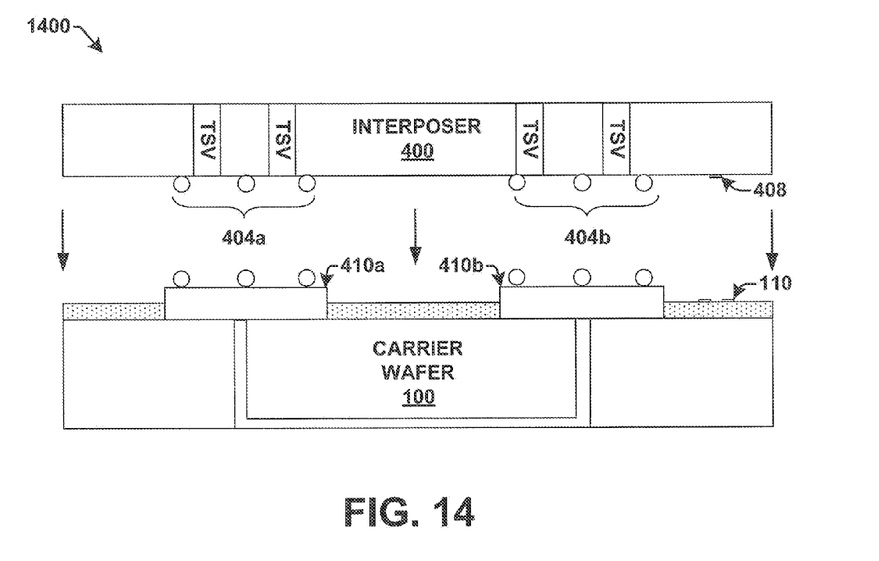

At 520 the temporal carrier wafer is bonded to the interposer wafer. In one embodiment, the alignment marks on the carrier wafer and the interposer wafer are first aligned and then the carrier wafer is bonded to the interposer wafer. FIG. 14 illustrates a cross sectional view 1400 of a carrier wafer 100 being bonded to an interposer wafer 400.

The carrier wafer may be removed from the top die and the interposer wafer at 522. In one embodiment, the carrier wafer may be removed from the top die by controlling the status of the vacuum holding the top die to the carrier wafer. After the carrier wafer is removed, the micro-bumps are reflowed and an underfill layer is dispensed and cured between top die and interposer. The interposer wafer is then diced.

Figure 15:
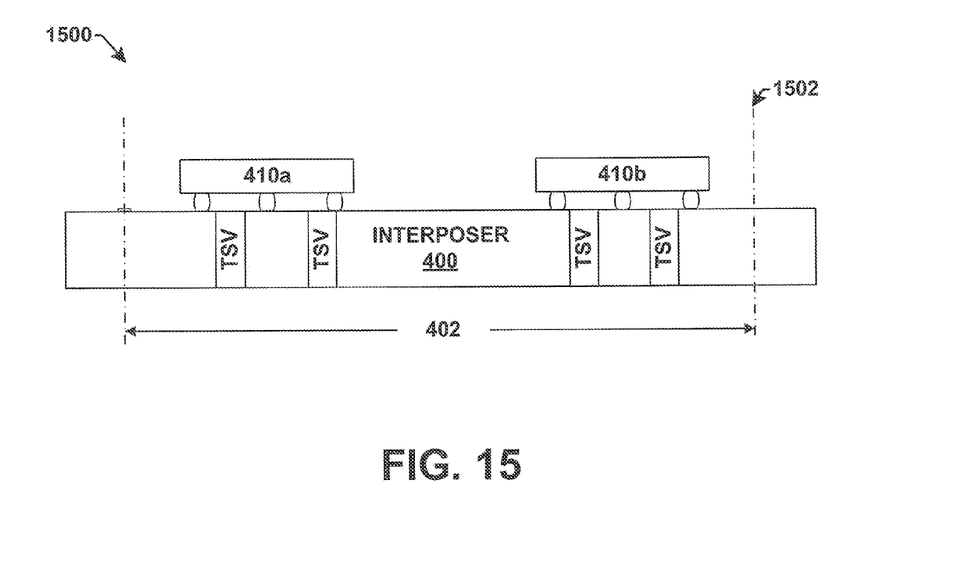

FIG. 15 illustrates a cross sectional view 1500 of an interposer wafer 400 connected to top die 410a, 410b with a carrier wafer removed. FIG. 15 further illustrates dice lines 1502. The connected interposer wafer 400 and top die, 410a and 410b, are diced after the carrier wafer has been removed according to the dice lines 1502 to form an interposer substrate 402 with top die 410a and 410b.

It will be appreciated that while reference is made throughout this document to exemplary structures in discussing aspects of methodologies described herein (e.g., those structures presented in FIGS. 6-15), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method of self aligning a top die onto a carrier wafer, comprising:
   providing a carrier wafer having a top surface and a bottom surface;
   applying a hydrophobic self assembled monolayer (SAM) to the top surface of the carrier wafer in a predefined pattern that defines one or more top die placement regions;
   providing a liquid to the to surface of the carrier wafer within the one or more top die placement regions;
   placing one or more to dies into contact with the liquid, wherein the surface tension of the liquid aligns the one or more to dies by generating a force that causes the one or more top dies to overlap with the one or more top die placement regions; and
   affixing the one or more top dies to the top surface of the carrier wafer by removing the liquid from the one or more top die placement regions by siphoning the liquid through one or more vias located within the one or more top die placement regions and extending from the top surface of the carrier wafer to the bottom surface of the carrier wafer.

2. The method of claim 1, wherein the one or more top die placement regions comprise a plurality of top die placement regions, and wherein different volumes of liquid are provided to respective top die placement regions.

3. The method of claim 1, further comprising:
affixing the carrier wafer to a self-alignment fixture comprising a liquid source configured to selectively provide a liquid by way of a liquid channel to the one or more vias and a vacuum source configured to selectively remove air or liquid by way of a first vacuum channel from the one or more vias.

4. The method of claim 3, further comprising:
bonding an interposer wafer to the one or more top die such that the one or more top die are in contact with one or more micro-bump regions on the interposer wafer; and
increasing pressure within the area of low pressure within the first vacuum channel to remove the carrier wafer from the one or more top die.

5. The method of claim 1, wherein:
the one or more top die placement regions have a size substantially equal to that of a corresponding top die.

6. The method of claim 1, further comprising:
applying a hydrophobic self assembled monolayer onto the outside edges of the bottom surface of the one or more top die to generate a non-hydrophobic region on the bottom surface of the one or more top die.

7. The method of claim 6, wherein:
the one or more top die placement regions have a size substantially equal to that of a non-hydrophobic region on a corresponding top die.

8. The method of claim 1, wherein providing a liquid to a top surface of the carrier wafer, comprises:
providing liquid from an external apparatus directly to the top surface of the carrier wafer.

9. The method of claim 1, wherein providing a liquid to a top surface of the carrier wafer, comprises:
providing liquid from the bottom surface of the carrier wafer, through one or more vias extending from the top surface of the carrier wafer to the bottom surface of the carrier wafer, to the top die placement regions.

10. The method of claim 1, wherein the carrier wafer comprises one or more trenches extending between the one or more vias along a bottom surface of the carrier wafer in a direction parallel to the surface of the carrier wafer.

11. The method of claim 3, further comprising:
operating the vacuum source to concurrently generate a low pressure within the first vacuum channel connected to the one or more vias and to a second vacuum channel connected directly to a bottom surface of the carrier wafer,
wherein the low pressure within the first vacuum channel holds the one or more top die to the carrier wafer, and wherein the low pressure within the second vacuum channel holds the carrier wafer to the self alignment fixture.

12. The method of claim 3, further comprising:
selectively operating a first valve located at an end of the liquid channel to selectively couple the liquid source to the one or more vias; and
selectively operating a second valve located at an end of the first vacuum channel to selectively couple the vacuum source to the one or more vias.

13. The method of claim 1, wherein the one or more vias have various diameters configured to provide varying amounts of liquid to the one or more top die placement regions.

\* \* \* \* \*

UNITED STATES PATENT AND TRADEMARK OFFICE
CERTIFICATE OF CORRECTION

PATENT NO. : 8,557,631 B2  
APPLICATION NO. : 13/308742  
DATED : October 15, 2013  
INVENTOR(S) : Chen-Hua Yu et al.

Page 1 of 1

It is certified that error appears in the above-identified patent and that said Letters Patent is hereby corrected as shown below:

In the Claims
Column 10, claim 1, line 50; please replace "to surface" with --top surface--
Column 10, claim 1, line 52; please replace "to dies" with --top dies--
Column 10, claim 1, line 54; please replace "to dies" with --top dies--

Signed and Sealed this
Twenty-sixth Day of November, 2013

Margaret A. Focarino
*Commissioner for Patents of the United States Patent and Trademark Office*